United States Patent
Hodota et al.

(10) Patent No.: US 8,592,837 B2
(45) Date of Patent: Nov. 26, 2013

(54) SEMICONDUCTOR LIGHT EMITTING ELEMENT, ELECTRONIC APPARATUS, AND LIGHT EMITTING DEVICE

(75) Inventors: Takashi Hodota, Ichihara (JP); Takehiko Okabe, Ichihara (JP)

(73) Assignee: Toyoda Gosei Co., Ltd., Aichi-ken (JP)

( * ) Notice: Subject to any disclaimer, the term of this patent is extended or adjusted under 35 U.S.C. 154(b) by 0 days.

(21) Appl. No.: 13/513,519

(22) PCT Filed: Dec. 2, 2010

(86) PCT No.: PCT/JP2010/071589
§ 371 (c)(1),
(2), (4) Date: Jun. 1, 2012

(87) PCT Pub. No.: WO2011/068161
PCT Pub. Date: Jun. 9, 2011

(65) Prior Publication Data
US 2012/0241721 A1    Sep. 27, 2012

(30) Foreign Application Priority Data

Dec. 4, 2009  (JP) .................................. 2009-276114

(51) Int. Cl.
*H01L 33/00*        (2010.01)
(52) U.S. Cl.
USPC ............... 257/88; 257/13; 257/91; 257/93; 257/99; 438/46; 438/47; 438/48
(58) Field of Classification Search
USPC .................. 257/13, 88, 91, 93, 99, E33.008; 438/34, 42, 46, 48
See application file for complete search history.

(56) References Cited

U.S. PATENT DOCUMENTS

| | | | |
|---|---|---|---|
| 8,022,435 B2 * | 9/2011 | Jeong | 257/99 |
| 2006/0192206 A1 | 8/2006 | Kong et al. | |
| 2007/0200493 A1 * | 8/2007 | Hsu et al. | 313/506 |
| 2007/0246716 A1 | 10/2007 | Bhat et al. | |
| 2009/0008668 A1 | 1/2009 | Matsumura | |

FOREIGN PATENT DOCUMENTS

| | | |
|---|---|---|
| JP | 2006-237550 A | 9/2006 |
| JP | 2007-294981 A | 11/2007 |
| JP | 2008-016809 A | 1/2008 |

(Continued)

*Primary Examiner* — Theresa T Doan
(74) *Attorney, Agent, or Firm* — Sughrue Mion, PLLC

(57) ABSTRACT

Disclosed is a semiconductor light emitting element (1) which includes: plural n-side columnar conductor portions (183), each of which is provided by penetrating a p-type semiconductor layer (160) and a light emitting layer (150), and is electrically connected to an n-type semiconductor layer (140); an n-side layer-like conductor portion (184), which is disposed on the rear surface side of the p-type semiconductor layer (160) to face the surface of the light emitting layer (150) when viewed from the light emitting layer (150), and is electrically connected to the n-side columnar conductor portions (183); plural p-side columnar conductor portions (173), each of which is electrically connected to the p-type semiconductor layer (160); and a p-side layer-like conductor portion (174), which is disposed on the rear surface side of the p-type semiconductor layer (160) to face the light emitting layer (150) when viewed from the light emitting layer (150), and is electrically connected to the p-side columnar conductor portions (173). Thus, nonuniformity of the quantity of light outputted from the light emitting layer of the semiconductor light emitting element is suppressed, and reduction of the area of the light emitting layer in the semiconductor light emitting element is suppressed.

8 Claims, 11 Drawing Sheets

(56) References Cited

FOREIGN PATENT DOCUMENTS

| | | |
|---|---|---|
| JP | 2008-135789 A | 6/2008 |
| JP | 2008-210900 A | 9/2008 |
| JP | 2008-288548 A | 11/2008 |
| JP | 2009-033133 A | 2/2009 |
| JP | 2009-164423 A | 7/2009 |

* cited by examiner

SEMICONDUCTOR LIGHT EMITTING ELEMENT, ELECTRONIC APPARATUS, AND LIGHT EMITTING DEVICE

CROSS REFERENCE TO RELATED APPLICATION

This application is a National Stage of International Application No. PCT/JP2010/071589, filed on Dec. 2, 2010, which claims priority from Japanese Patent Application No. 2009-276114, filed on Dec. 4, 2009, the contents of all of which are incorporated herein by reference in their entirety.

TECHNICAL FIELD

The present invention relates to a semiconductor light emitting element, an electronic apparatus and a light emitting device that emit light by application of current.

BACKGROUND ART

A semiconductor light emitting element using a group III nitride semiconductor such as GaN is usually configured by forming a thin film of the group III nitride semiconductor including an n-type semiconductor layer, a light emitting layer and a p-type semiconductor layer in order on a substrate of, for example, sapphire.

Here, the thin film of the group III nitride semiconductor is known to have a property that diffusion of current in an in-plane direction of the thin film is small. Accordingly, in a semiconductor light emitting element using the group III nitride semiconductor, an amount of electric current at a location far from an electrode is prone to be small compared to that at a location near the electrode, and as a result, non-uniformity of quantity of light emitted from the light emitting layer is apt to be caused.

As a conventional art described in a gazette, there is known a semiconductor light emitting element having a substantially quadrangular shape, in which an extended electrode is formed on an n-type semiconductor layer exposed by removing a p-type semiconductor layer and a light emitting layer along four sides of the semiconductor light emitting element and a finger electrode connected to the extended electrode is formed on the n-type semiconductor layer exposed by removing the p-type semiconductor layer and the light emitting layer in a direction of a diagonal line of the semiconductor light emitting element, and thereby an electric current flowing from the p-type semiconductor layer to the n-type semiconductor layer through the light emitting layer is diffused (refer to Patent Document 1). In addition, in the Patent Document 1, it is also described that plural p-bonding pad electrodes are provided on the p-type semiconductor layer.

CITATION LIST

Patent Literature

Patent Document 1: Japanese Patent Application Laid-open Publication No. 2006-237550

SUMMARY OF INVENTION

Technical Problem

However, in the case where the electrodes are linearly formed on the n-type semiconductor layer for diffusing the electric current, it becomes necessary to remove the light emitting layer at the portions where the electrodes are formed, and therefore the area of the light emitting layer is reduced by that amount. Further, in the case where the plural p-bonding pad electrodes are provided, it becomes difficult to mount the semiconductor light emitting element onto a wiring board or the like.

It is an object of the present invention to suppress nonuniformity of the quantity of light outputted from the light emitting layer of the semiconductor light emitting element, and to suppress reduction of the area of the light emitting layer in the semiconductor light emitting element.

Solution to Problem

In order to attain the object, a semiconductor light emitting element to which the present invention is applied includes: a first semiconductor layer that is configured with a group III nitride semiconductor having a first conduction type; a light emitting layer that is configured with a group III nitride semiconductor, laminated on the first semiconductor layer, and emits light by passing an electric current therethrough; a second semiconductor layer that is configured with a group III nitride semiconductor having a second conduction type that is different from the first conduction type, and is laminated on the light emitting layer; plural first conductor portions, each of which is provided to penetrate the second semiconductor layer and the light emitting layer, electrically insulated from the second semiconductor layer and the light emitting layer and is electrically connected to the first semiconductor layer; a first connective conductor portion that is provided on a back surface side of the second semiconductor layer as viewed from the light emitting layer to face a surface of the light emitting layer and is electrically connected to the plural first conductor portions; plural second conductor portions, each of which is electrically insulated from the first conductor portions and the first connective conductor portion and is electrically connected to the second semiconductor layer; and a second connective conductor portion that is provided on a back surface side of the second semiconductor layer as viewed from the light emitting layer to face the light emitting layer, electrically insulated from the first conductor portions and the first connective conductor portion and is electrically connected to the plural second conductor portions.

In such a semiconductor light emitting element, the first connective conductor portion and the second connective conductor portion are arranged to be overlaid on the surface of the light emitting layer.

In addition, one of the second conductor portions is arranged among the plural first conductor portions or one of the first conductor portions is arranged among the plural second conductor portions with respect to the surface of the light emitting layer.

Further, the plural first conductor portions and the plural second conductor portions are arranged in a staggered configuration with respect to the surface of the light emitting layer.

Still further, the semiconductor light emitting element further includes a diffusing layer that is laminated on the second semiconductor layer and is electrically connected to the plural second conductor portions to diffuse an electric current supplied through the plural second conductor portions. The diffusing layer contains a metal layer having a reflective property to light emitted from the light emitting layer.

Then, the semiconductor light emitting element further includes an insulating portion that electrically insulates the first conductor portions and the first connective conductor portion from the second conductor portions and the second connective conductor portion. The insulating portion is configured with a multi-layer reflecting film that is configured by alternately laminating a first-refractive-index layer having a first refractive index and transparency to light emitted from the light emitting layer and a second-refractive-index layer having a second refractive index, which is higher than the first refractive index, and transparency to the light emitted from the light emitting layer. The multi-layer reflecting film reflects the light emitted from the light emitting layer.

In addition, an electronic apparatus to which the present invention is applied incorporates the aforementioned semiconductor light emitting element.

Further, from another point of view, a light emitting device to which the present invention is applied includes: a base portion on which a first wiring and a second wiring are formed; and a semiconductor light emitting element that is mounted on the base portion with flip-chip connection, wherein the semiconductor light emitting element includes: a first semiconductor layer that is configured with a group III nitride semiconductor having a first conduction type; a light emitting layer that is configured with a group III nitride semiconductor, laminated on the first semiconductor layer, and emits light by passing an electric current therethrough; a second semiconductor layer that is configured with a group III nitride semiconductor having a second conduction type that is different from the first conduction type, and is laminated on the light emitting layer; plural first conductor portions, each of which is provided to penetrate the second semiconductor layer and the light emitting layer, electrically insulated from the second semiconductor layer and the light emitting layer and is electrically connected to the first semiconductor layer; a first connective conductor portion that is provided on a back surface side of the second semiconductor layer as viewed from the light emitting layer to face a surface of the light emitting layer and is electrically connected to the plural first conductor portions and the first wiring provided on the base portion; plural second conductor portions, each of which is electrically insulated from the first conductor portions and the first connective conductor portion and is electrically connected to the second semiconductor layer; and a second connective conductor portion that is provided on a back surface side of the second semiconductor layer as viewed from the light emitting layer to face the light emitting layer, electrically insulated from the first conductor portions and the first connective conductor portion and is electrically connected to the plural second conductor portions and the second wiring provided on the base portion.

Advantageous Effects of Invention

According to the present invention, it is possible to suppress nonuniformity of the quantity of light outputted from the light emitting layer of the semiconductor light emitting element, and to suppress reduction of the area of the light emitting layer in the semiconductor light emitting element.

DESCRIPTION OF EMBODIMENTS

Hereinafter, exemplary embodiments according to the present invention will be described in detail with reference to the accompanying drawings.

Exemplary Embodiment 1

Figure 1A:
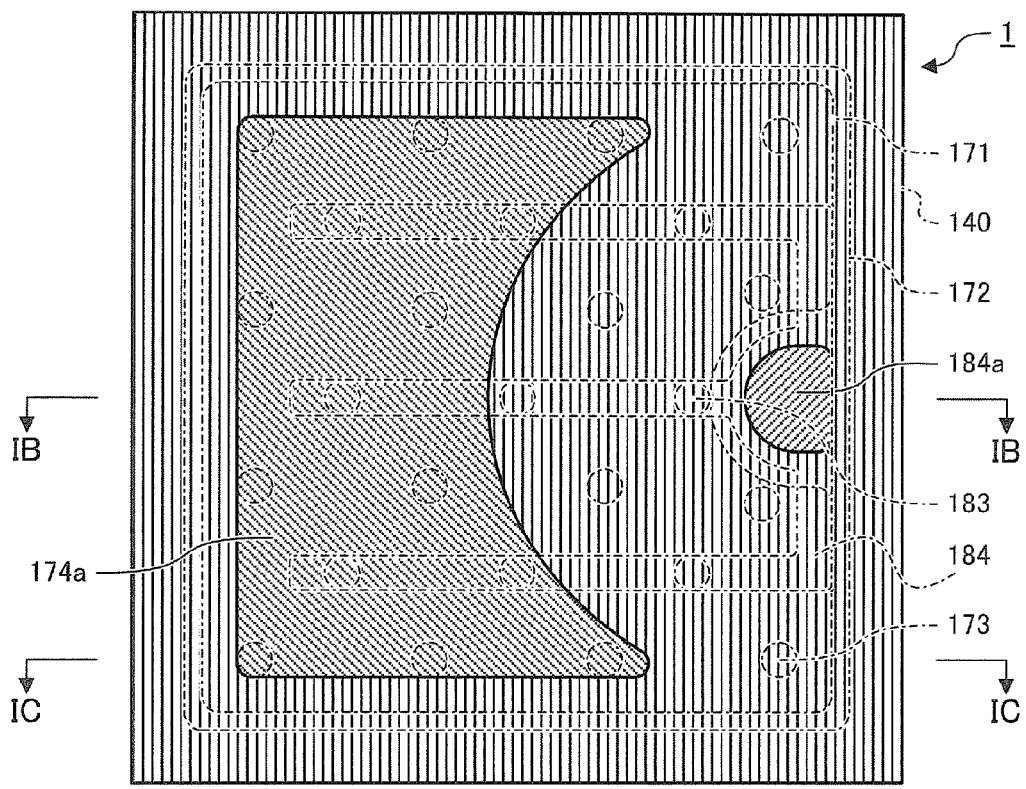
FIGS. 1A to 1C are diagrams illustrating an example of a configuration of a semiconductor light emitting element to which the exemplary embodiment is applied.
Figure 1B:
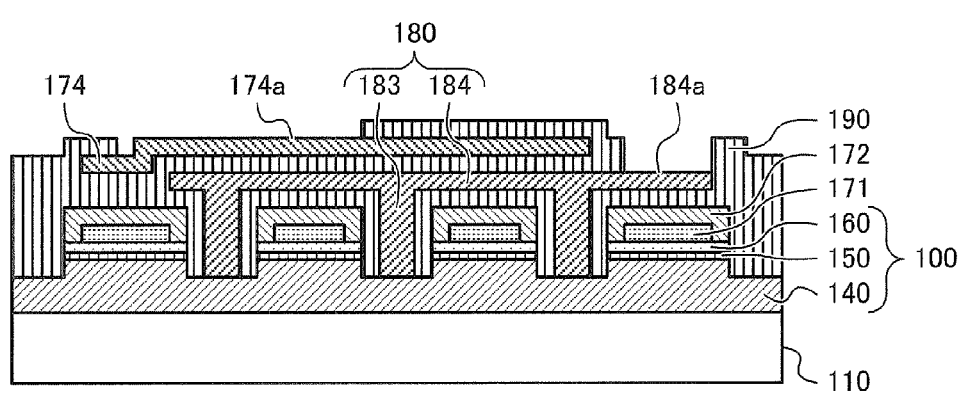
Figure 1C:
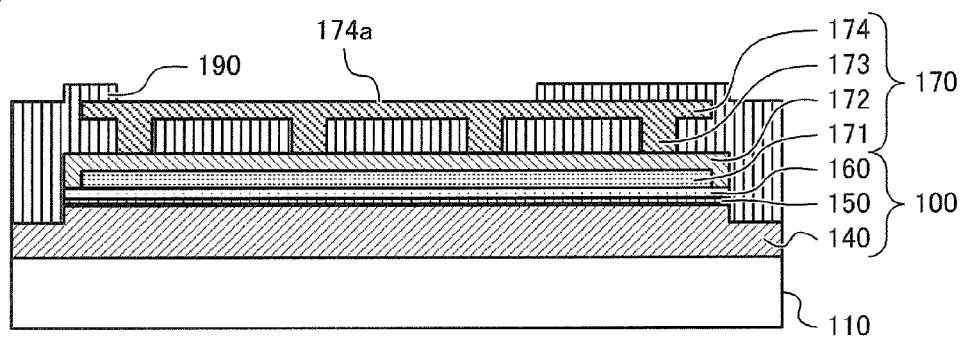

FIGS. 1A to 1C are diagrams illustrating an example of a configuration of a semiconductor light emitting element 1 to which the exemplary embodiment is applied. Here, FIG. 1A shows a top view of the semiconductor light emitting element 1, FIG. 1B shows a cross-portional view taken along IB-IB in FIG. 1A, and FIG. 1C shows a cross-portional view taken along IC-IC in FIG. 1A.

(Semiconductor Light Emitting Element)

The semiconductor light emitting element 1 according to the exemplary embodiment includes: a substrate 110; an n-type semiconductor layer 140 laminated on the substrate 110; a light emitting layer 150 laminated on the n-type semiconductor layer 140; and a p-type semiconductor layer 160 laminated on the light emitting layer 150. It should be noted that, in the following description, these n-type semiconductor layer 140, light emitting layer 150 and p-type semiconductor layer 160 will be collectively referred to as a laminated semiconductor layer 100 as necessary.

Further, the semiconductor light emitting element 1 includes: a p-side power supply portion 170 electrically connected to the p-type semiconductor layer 160; and an n-side power supply portion 180 electrically connected to an exposure surface of the n-type semiconductor layer 140, which has been exposed by cutting out a part of the laminated p-type semiconductor layer 160, the light emitting layer 150 and the n-type semiconductor layer 140.

Among these, the p-side power supply portion 170 has: a power supply reflecting layer 171 laminated on the p-type semiconductor layer 160; and an overcoat layer 172 laminated on the power supply reflecting layer 171 so as to sandwich the power supply reflecting layer 171 with the p-type semiconductor layer 160. Moreover, the power supply reflecting layer 171 is configured with a transparent electrode layer (not shown) formed on the p-type semiconductor layer 160 and a metal layer (not shown) formed on the transparent electrode layer. It should be noted that, in the power supply reflecting layer 171 and the overcoat layer 172, as will be descried later, 9 holes are formed in a matrix state to penetrate and reach the n-type semiconductor layer 140.

In addition, the p-side power supply portion 170 further includes: plural (in this specific example, 16) p-side columnar conductor portions 173 provided on the overcoat layer 172 in a matrix state, each of which is electrically connected to the overcoat layer 172; and a p-side layer-like conductor portion 174 electrically connected to each of the p-side columnar conductor portions 173 at an upper portion of each of the p-side columnar conductor portions 173. It should be noted that, in the exemplary embodiment, the p-side columnar conductor portions 173 and the p-side layer-like conductor portion 174 function as a second conductor portion and a second connective conductor portion, respectively.

On the other hand, the n-side power supply portion 180 includes: plural (in this specific example, 9) n-side columnar conductor portions 183 each of which is provided in each of the 9 holes provided to penetrate the power supply reflecting layer 171 and the overcoat layer 172 in the aforementioned p-side power supply portion 170 and is electrically connected to the n-type semiconductor layer 140 exposed at the bottom portion; and an n-side layer-like conductor portion 184 connected to each of the n-side columnar conductor portions 183 at the upper portions of the 9 n-side columnar conductor portions 183. It should be noted that, in the exemplary embodiment, the n-side columnar conductor portions 183 and the n-side layer-like conductor portion 184 function as a first conductor portion and a first connective conductor portion, respectively.

Still further, the semiconductor light emitting element 1 includes a protecting layer 190 that protects the light emitting layer 150 and the like from water content likely to enter from the outside. Here, the protecting layer 190 also has a function to electrically insulate the n-type semiconductor layer 140 and the light emitting layer 150 from the p-side power supply portion 170, electrically insulate the light emitting layer 150 and the p-type semiconductor layer 160 from the n-side power supply portion 180, and electrically insulate the p-side power supply portion 170 from the n-side power supply portion 180.

In the semiconductor light emitting element 1, part of the p-side layer-like conductor portion 174 is exposed without being covered with the protecting layer 190, and the portion is a p-side power supply electrode 174a used for electrical connection with the outside. In addition, in the semiconductor light emitting element 1, part of the n-side layer-like conductor portion 184 is exposed without being covered with the protecting layer 190, and the portion is an n-side power supply electrode 184a used for electrical connection with the outside.

In this manner, the semiconductor light emitting element 1 according to the exemplary embodiment has a configuration in which the p-side power supply electrode 174a and the n-side power supply electrode 184a are formed on one surface thereof that is opposite to the substrate 110. Further, in this semiconductor light emitting element 1, the light emitting layer 150 emits light by passing a current through the laminated semiconductor layer 100 (more specifically, the p-type semiconductor layer 160, the light emitting layer 150 and the n-type semiconductor layer 140) assuming that the p-side power supply electrode 174a is a positive electrode and the n-side power supply electrode 184a is a negative electrode. The semiconductor light emitting element 1 is mounted with a so-called flip-chip connection and used so as to extract light emitted from the light emitting layer 150 on the n-type semiconductor layer 140 side. However, the substrate 110 is not indispensable in the semiconductor light emitting element 1 of the exemplary embodiment.

Figure 2:
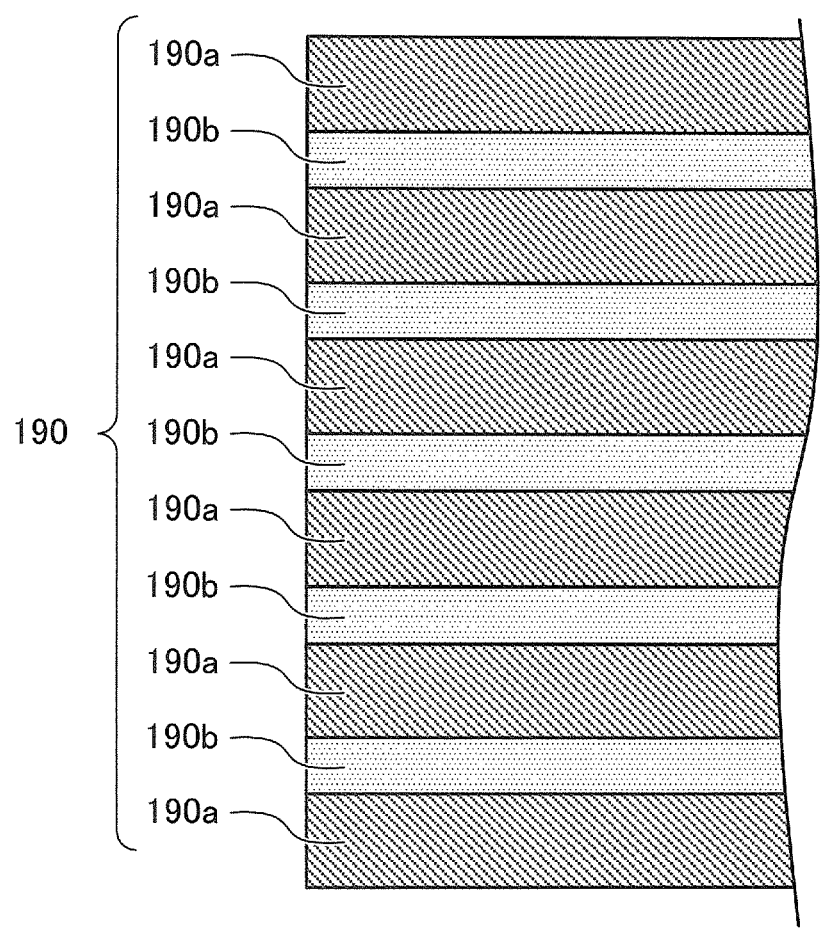
FIG. 2 is a diagram illustrating an example of a cross-portional schematic diagram of a protecting layer in the semiconductor light emitting element.

FIG. 2 illustrates an example of a cross-portional schematic diagram of the protecting layer 190 as an example of an insulating portion.

The protecting layer 190 is configured as a multi-layer reflecting film in which low-refractive-index layers 190a as an example of a first refractive index layer and high-refractive-index layers 190b as an example of a second refractive index layer, being different in refractive indexes, are alternately laminated. Especially, the exemplary embodiment employs a configuration in which one high-refractive-index layer 190b is sandwiched by two low-refractive-index layers 190a, and in this specific example, five high-refractive-index layers 190b are sandwiched between six low-refractive-index layers 190a to provide eleven layers of laminated layer configuration in total.

As the low-refractive-index layer 190a and the high-refractive-index layer 190b, a material having high optical transparent properties to the light emitted from the light emitting layer 150 is used. Here, as the low-refractive-index layer 190a, for example, SiO$_2$ (silicon oxide) or MgF$_2$ (magnesium fluoride) can be used, and as the high-refractive-index layer 190b, TiO$_2$ (titanium oxide), Ta$_2$O$_5$ (tantalum oxide), ZrO$_2$ (zirconium oxide), HfO$_2$ (hafnium oxide) or Nb$_2$O$_5$ (niobium oxide) can be used. However, as long as a relationship of refractive index with the high-refractive-index layer 190b is satisfied, these TiO$_2$, Ta$_2$O$_5$, ZrO$_2$, HfO$_2$ or Nb$_2$O$_5$ may be used as the low-refractive-index layer 190a.

In the exemplary embodiment, SiO$_2$ (silicon oxide, refractive index nL=1.4879 to light having wavelength of 455 nm) is used as the low-refractive-index layer 190a, and TiO$_2$ (titanium oxide, refractive index nH=2.5276 to light having wavelength of 455 nm) is used as the high-refractive-index layer 190b. These have high optical transparency to the light of the light emitting layer 150 with light emission wavelength λ (=400 nm to 460 nm). It should be noted that, in the case where the light emission wavelength λ of the light emitting layer 150 is still shorter, and light of the near-ultraviolet region is emitted, it is desirable of use Ta$_2$O$_5$ (tantalum oxide), Nb$_2$O$_5$ (niobium oxide), ZrO$_2$ (zirconium oxide), or HfO$_2$ (hafnium oxide) or the like having optical band gap larger than that of TiO$_2$ (titanium oxide) as the high-refractive-index layer 190b instead of TiO$_2$ (titanium oxide), which absorbs the light of the near-ultraviolet region. However, even in the case where the light emitting layer 150 emits light in the ultraviolet region, SiO$_2$ (silicon oxide) can be used as the low-refractive-index layer 190a.

Further, when it is supposed that the light emission wavelength of the light emitting layer 150 is λ (nm), the refractive index of the low-refractive-index layer 190a to the light emission wavelength λ is $n_L$ and the refractive index of the high-refractive-index layer 190b to the light emission wavelength λ is $n_H$, thickness $d_L$ of each low-refractive-index layer 190a and thickness $d_H$ of each high-refractive-index layer 190b are set based on the expressions shown as follows.

$$d_L = \frac{\lambda}{4 \times n_L} \quad (1)$$

$$d_H = \frac{\lambda}{4 \times n_H} \quad (2)$$

Then, subsequently, a detailed configuration of each component in the semiconductor light emitting element 1 shown in FIGS. 1A to 1C will be described together with a production method of the semiconductor light emitting element 1. The semiconductor light emitting element 1 shown in FIGS. 1A to 1C is obtained by: a semiconductor layer forming process in which the laminated semiconductor layer 100 is laminated on the substrate 110; a conductive layer forming process in which a conductive layer including the power supply reflecting layer 171 and the overcoat layer 172 is formed on the laminated semiconductor layer 100 on the substrate 110; a first protecting layer forming process in which a partial layer (referred to as a first protecting layer) of the protecting layer 190 is formed after the power supply reflecting layer 171 and the overcoat layer 172 are formed; an n-side power supply portion forming process in which the n-side power supply portion 180 is formed after the first protecting layer is formed; a second protecting layer forming process in which a partial layer (referred to as a second protecting layer) of the protecting layer 190 is formed after the n-side power supply portion 180 is formed; a p-side power supply portion forming process in which the p-side columnar conductor portions 173 and the p-side layer-like conductor portion 174 of the p-side power supply portion 170 are formed after the second protecting layer is formed; and a third protecting layer forming process in which a partial layer (referred to as a third protecting layer) that is the remainder of the protecting layer 190 is formed after the p-side power supply portion 170 is formed.

First, the substrate 110 used in the exemplary embodiment will be described.

As the substrate 110, there is no particular limitation on any substrate as long as group III nitride semiconductor crystals are epitaxially grown on a surface thereof, and accordingly, various kinds of substrate can be selected and used. However, as described above, since the semiconductor light emitting element 1 of the exemplary embodiment is flip-chip mounted so that the light is extracted from the substrate 110 side, it is preferable to have transparency to the light emitted from the light emitting layer 150. Accordingly, the substrate 110 composed of, for example, sapphire, zinc oxide, magnesium oxide, zirconium oxide, magnesium-aluminum oxide, gallium oxide, indium oxide, lithium-gallium oxide, lithium-aluminum oxide, neodymium-gallium oxide, lanthanum-strontium-aluminum-tantalum oxide, strontium-titanium oxide, titanium oxide and the like can be used.

Moreover, among the above-described materials, it is preferable to use sapphire in which C-plane is a principal plane as the substrate 110. In the case where the sapphire is used as the substrate 110, the laminated semiconductor layer 100 may be formed after an intermediate layer (buffer layer) for adjusting a lattice constant is formed on the C-plane of the sapphire.

Hereinafter, each process will be specifically described. It should be noted that, in the following description, AlGaN, GaN and GaInN are described with the compositional ratio of each element being omitted in some cases.

<Semiconductor Layer Forming Process>

Figure 3A:
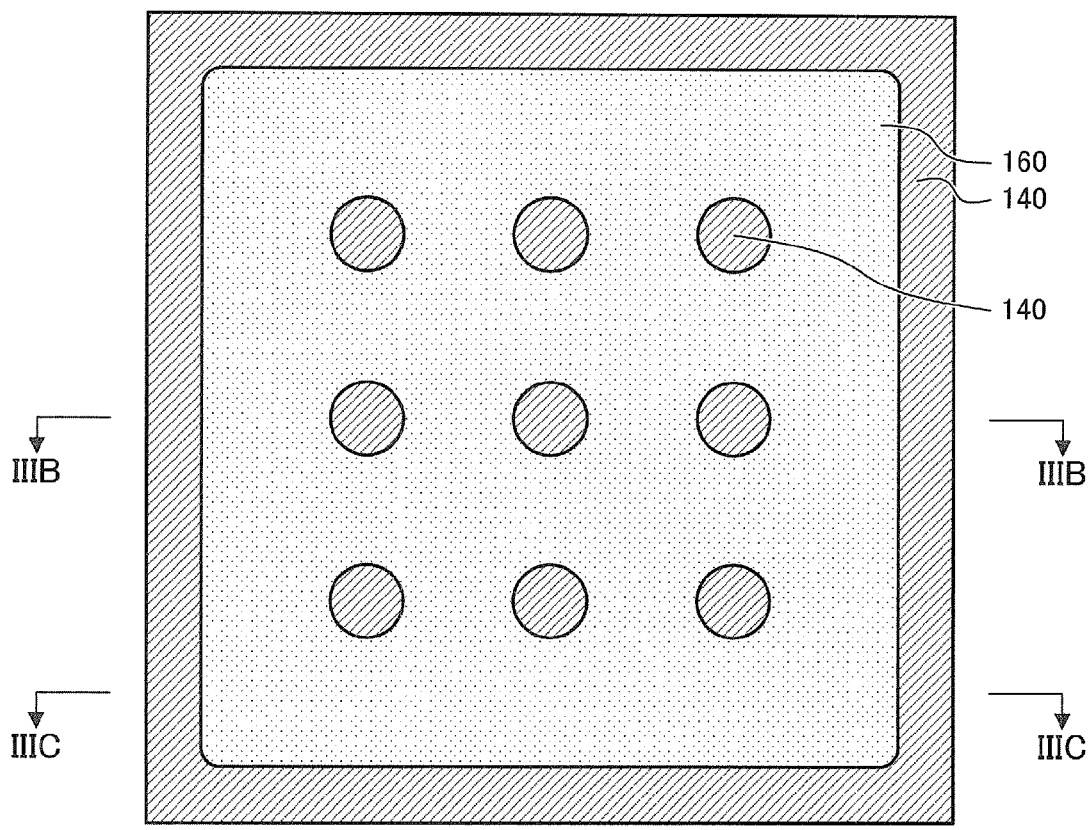
FIGS. 3A to 3C are diagrams illustrating an example of a semiconductor layer forming process.
Figure 3B:
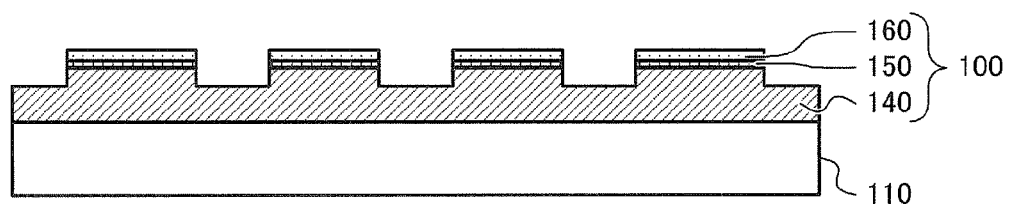
Figure 3C:
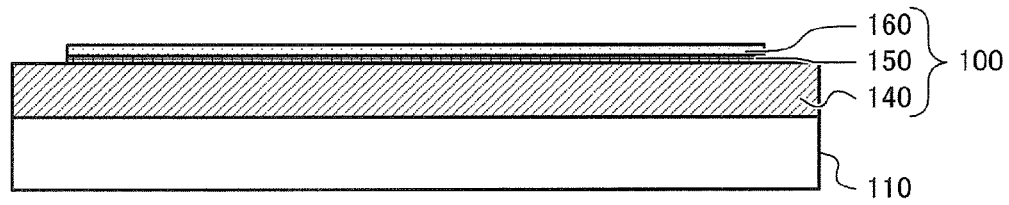

FIGS. 3A to 3C are diagrams for illustrating the semiconductor layer forming process. Here, FIG. 3A shows a top view corresponding to FIG. 1A, FIG. 3B shows a cross-portional view corresponding to FIG. 1B, which is taken along IIIB-IIIB in FIG. 3A, and FIG. 3C shows a cross-portional view corresponding to FIG. 1C, which is taken along IIIC-IIIC in FIG. 3A.

In the semiconductor layer forming process, first, the laminated semiconductor layer 100, namely, the n-type semiconductor layer 140, the light emitting layer 150 and the p-type semiconductor layer 160 are laminated in this order on the substrate 110 or the intermediate layer (not shown) laminated on one surface of the substrate 110. It should be noted that the laminated semiconductor layer 100 with excellent crystallinity can be obtained by forming by an MOCVD method, however, a sputtering method under optimized conditions can form the laminated semiconductor layer 100 having more excellent crystallinity than that formed by the MOCVD method.

Then, in the semiconductor layer forming process, after the laminated semiconductor layer 100 (the n-type semiconductor layer 140, the light emitting layer 150 and the p-type semiconductor layer 160) is laminated on the substrate 110, dry etching is performed on edge portions thereof and planned locations where the n-side columnar conductor portions 183 shown in FIGS. 1A to 1C are to be formed, and the n-type semiconductor layer 140 is exposed at these locations. It should be noted that, in the dry etching, part of the n-type semiconductor layer 140 may be engraved. This forms 9 (3×3) circular holes in total in a matrix state in the laminated semiconductor layer 100.

With regard to the circular hole, the diameter is preferably in a range of 10 μm to 50 μm, the length (depth) is preferably in a range of 800 nm to 5 μm, and for example, the diameter of 10 μm is adopted. Here, in the case where the diameter of the hole is smaller than 10 μm, it becomes difficult to form the n-side columnar conductor portion 183 at the inside of each of the 9 holes by filling the metal in the n-side power supply portion forming process described later, and a contact resistance of an interface between the n-side columnar conductor portion 183 and the n-type semiconductor layer 140 becomes higher, and thereby efficiency of current diffusion is reduced. On the other hand, in the case where the diameter of the hole is larger than 50 μm, the light emission area is reduced, and therefore, it is unfavorable as a light emitting element.

Here, the n-type semiconductor layer 140 as an example of the first semiconductor layer performs electrical conduction with, for example, a first conduction type in which an electron is a carrier. Further, the n-type semiconductor layer 140 is preferably configured with an n-contact layer laminated on the substrate 110 and an n-cladding layer laminated on the n-contact layer. Here, the n-contact layer is a layer for electrically connecting to, for example, the plural n-side columnar conductor portions 183 shown in FIGS. 1A to 1C. Moreover, it is desirable to configure the n-contact layer with $Al_xGa_{1-x}N$ ($0 \leq x<1$, preferably $0 \leq x \leq 0.5$, and more preferably $0 \leq x \leq 0.1$) added with a group IV element containing Si, Ge, Sn or the like as n-type impurities. On the other hand, the n-cladding layer is a layer for performing injection of the carriers into the light emitting layer 150 and confinement of the carriers. It is possible to configure the n-cladding layer with AlGaN, GaN, GaInN or the like added with the aforementioned n-type impurities.

Further, the light emitting layer 150 is a layer that emits light by passing a current, and a single quantum well structure or a multiple quantum well structure can be employed.

As a well layer having the single quantum well structure, the group III nitride semiconductor layer composed of $Ga_{1-y}In_yN$ ($0<y<0.4$) is usually used. Moreover, in the case of the light emitting layer 150 of the multiple quantum well structure, the above-described $Ga_{1-y}In_yN$ is employed as the well layer, and $Al_zGa_{1-z}N$ ($0 \leq z<0.3$) having band gap energy larger than that of the well layer is employed as a barrier layer. In this case, the well layer and the barrier layer may be doped or not doped with impurities depending upon a design thereof.

It should be noted that, in the exemplary embodiment, by adjusting composition of In of the well layer, the light emitting layer 150 is capable of emitting light of the ultraviolet region to the green region (light emission wavelength λ is of the order of 365 nm to 540 nm).

Further, the p-type semiconductor layer 160 as an example of the second semiconductor layer performs electrical conduction with, for example, a second conduction type in which a hole is a carrier. Further, the p-type semiconductor layer 160 is preferably configured with a p-cladding layer laminated on the light emitting layer 150 side and a p-contact layer laminated on the p-cladding layer. Here, the p-cladding layer is a layer for performing injection of the carriers into the light emitting layer 150 and confinement of the carriers. The p-cladding layer is not particularly limited as long as the layer has a composition such that band gap energy thereof becomes larger than that of the light emitting layer 150 and the layer is capable of confining the carriers into the light emitting element, however, it is desirable to configure the layer with $Al_xGa_{1-x}N$ (0<x≤0.4) added with Mg or the like as p-type impurities. On the other hand, the p-contact layer is a layer for electrically connecting to, for example, the plural p-side columnar conductor portions 173 shown in FIGS. 1A to 1C. Moreover, it is possible to configure the p-contact layer with $Al_xGa_{1-x}N$ (0<x≤0.4) added with the aforementioned p-type impurities.

<Conductive Layer Forming Process>

Figure 4A:
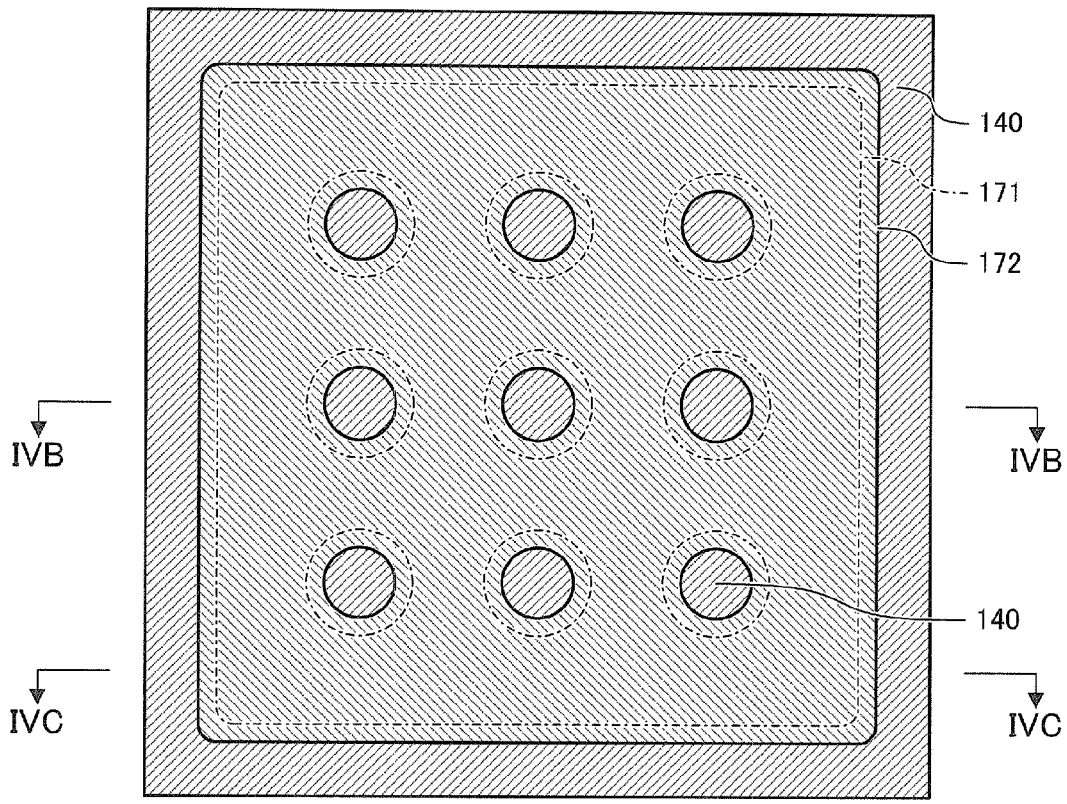
FIGS. 4A to 4C are diagrams illustrating an example of a conductive layer forming process.
Figure 4B:
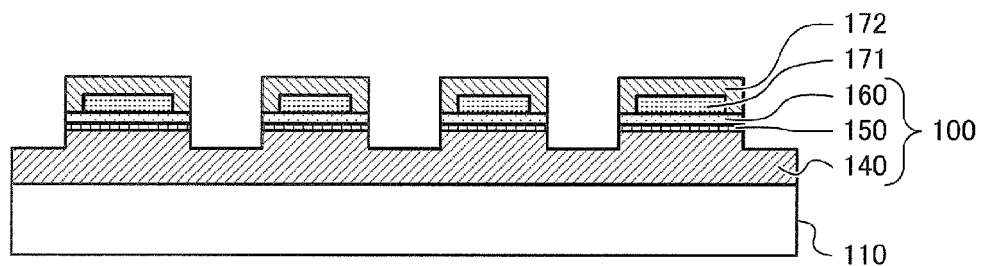
Figure 4C:
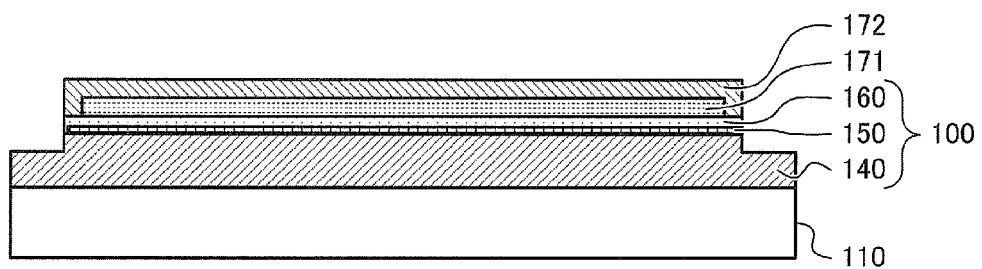

FIGS. 4A to 4C are diagrams for illustrating an example of the conductive layer forming process. Here, FIG. 4A shows a top view corresponding to FIG. 1A, FIG. 4B shows a cross-portional view corresponding to FIG. 1B, which is taken along IVB-IVB in FIG. 4A, and FIG. 4C shows a cross-portional view corresponding to FIG. 1C, which is taken along IVC-IVC in FIG. 4A.

In the conductive layer forming process, the power supply reflecting layer 171 is laminated on the p-type semiconductor layer 160 except for a boundary side with the exposed portion of the n-type semiconductor layer 140, and subsequently, the overcoat layer 172 is laminated to cover and sandwich the power supply reflecting layer 171 with the p-type semiconductor layer 160. In the exemplary embodiment, the power supply reflecting layer 171 and the overcoat layer 172 function as a diffusing layer. It should be noted that the power supply reflecting layer 171 and the overcoat layer 172 can be formed by, for example, a sputtering method. Further, in the state where the conductive layer forming process is completed, the n-type semiconductor layer 140 having been exposed in the semiconductor layer forming process maintains the exposed state just as it is.

Here, it is preferable to configure the power supply reflecting layer 171 with a transparent conductive layer laminated on the p-type semiconductor layer 160 and a metal reflecting layer, as an example of a metal layer, laminated on the transparent conductive layer. Of these, with regard to the transparent conductive layer, the material may be appropriately selected from various kinds of materials; however, for example, oxides containing In, and more preferably, IZO ($In_2O_3$—ZnO) can be used.

The thickness of the transparent conductive layer is preferably in a range of 50 nm to 500 nm. In the case where the thickness is less than 50 nm, the resistance tends to be higher and the functions as the current diffusing layer are deteriorated, thus resulting in deterioration of light emission output. In the case where the thickness is more than 500 nm, the transparency as a transparent conductive layer is deteriorated, thus resulting in deterioration of light emission output.

Moreover, as the metal reflecting layer, it is preferable to use a material having high reflection coefficient to the light emission wavelength λ of the light emitting layer 150, and Ag or an alloy containing Ag is preferably used, for example.

The thickness of the metal reflecting layer is preferably in a range of 80 nm to 200 nm. In the case where the thickness is less than 80 nm, the reflection coefficient by the metal reflecting layer is reduced; therefore, it is unfavorable. Further, in the case where the thickness is more than 200 nm, production costs of the light emitting element are increased; therefore, it is unfavorable.

On the other hand, the overcoat layer 172 suppresses migration of Ag in the case where the metal reflecting layer is configured with Ag, and Ta or TaN can be used, for example.

The thickness of the overcoat layer 172 is preferably in a range of 20 nm to 200 nm. In the case where the thickness is less than 20 nm, it becomes impossible to suppress migration of the metal reflecting layer (in this example, Ag). Further, in the case where the thickness is more than 200 nm, production costs of the light emitting element are increased; therefore, it is unfavorable.

<First Protecting Layer Forming Process>

Figure 5A:
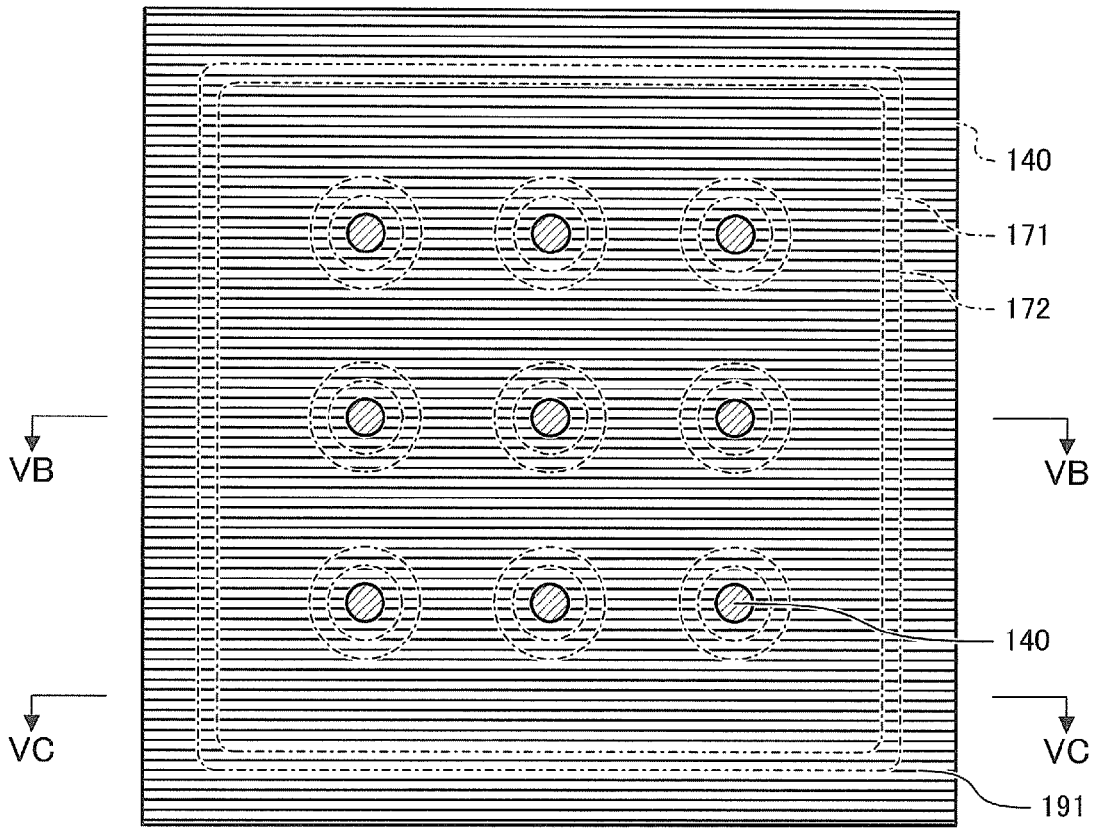
FIGS. 5A to 5C are diagrams illustrating an example of a first protecting layer forming process.
Figure 5B:
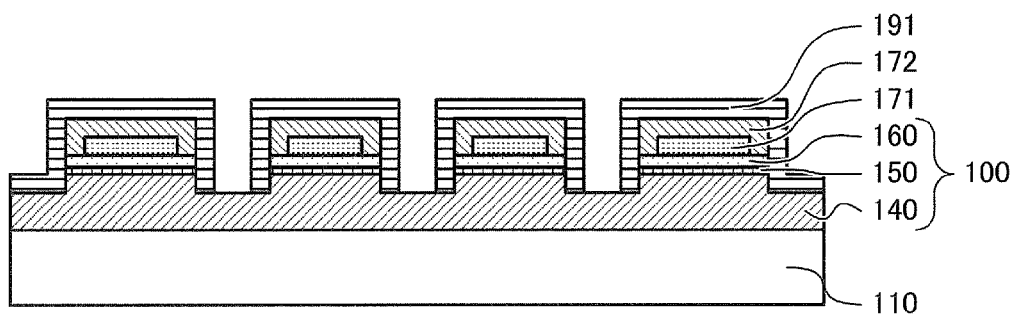
Figure 5C:
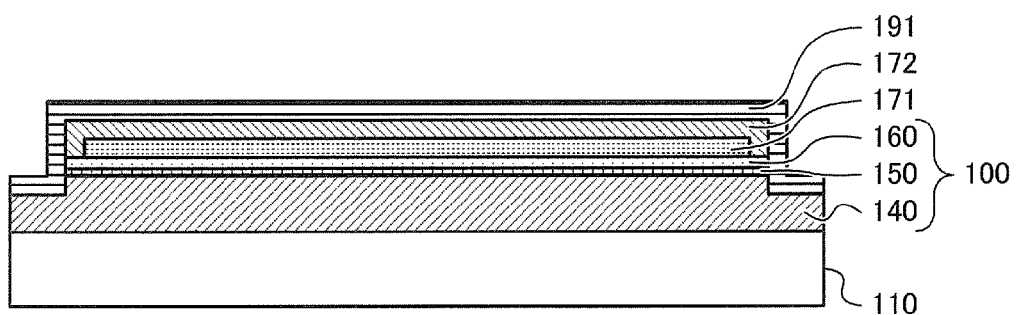

FIGS. 5A to 5C are diagrams for illustrating an example of the first protecting layer forming process. Here, FIG. 5A shows a top view corresponding to FIG. 1A, FIG. 5B shows a cross-portional view corresponding to FIG. 1B, which is taken along VB-VB in FIG. 5A, and FIG. 5C shows a cross-portional view corresponding to FIG. 1C, which is taken along VC-VC in FIG. 5A.

In the first protecting layer forming process, first, the first protecting layer 191 is laminated on an entire top surface. Here, the first protecting layer 191 corresponds to four layers of the protecting layer 190, and is configured by laminating the low-refractive-index layer 190a composed of $SiO_2$, the high-refractive-index layer 190b composed of $TiO_2$, the low-refractive-index layer 190a composed of $SiO_2$ and the high-refractive-index layer 190b composed of $TiO_2$ in this order. At this time, the first protecting layer 191 covers wall surfaces of edge portions and wall surfaces of 9 holes formed in the matrix state, as well as covering the overcoat layer 172 and the n-type semiconductor layer 140 having been exposed at an upper portion. It should be noted that the first protecting layer 191 can be formed by, for example, the sputtering method.

Then, in the first protecting layer forming process, after forming the first protecting layer 191, dry etching is performed on center portions of bottom surfaces of the 9 holes to expose the n-type semiconductor layer 140 at these portions. However, in the dry etching, the first protecting layer 191 is not removed from the wall surfaces of the 9 holes. Accordingly, as shown in FIG. 5B, the 9 holes in the matrix state are formed to expose the n-type semiconductor layer 140.

<N-Side Power Supply Portion Forming Process>

Figure 6A:
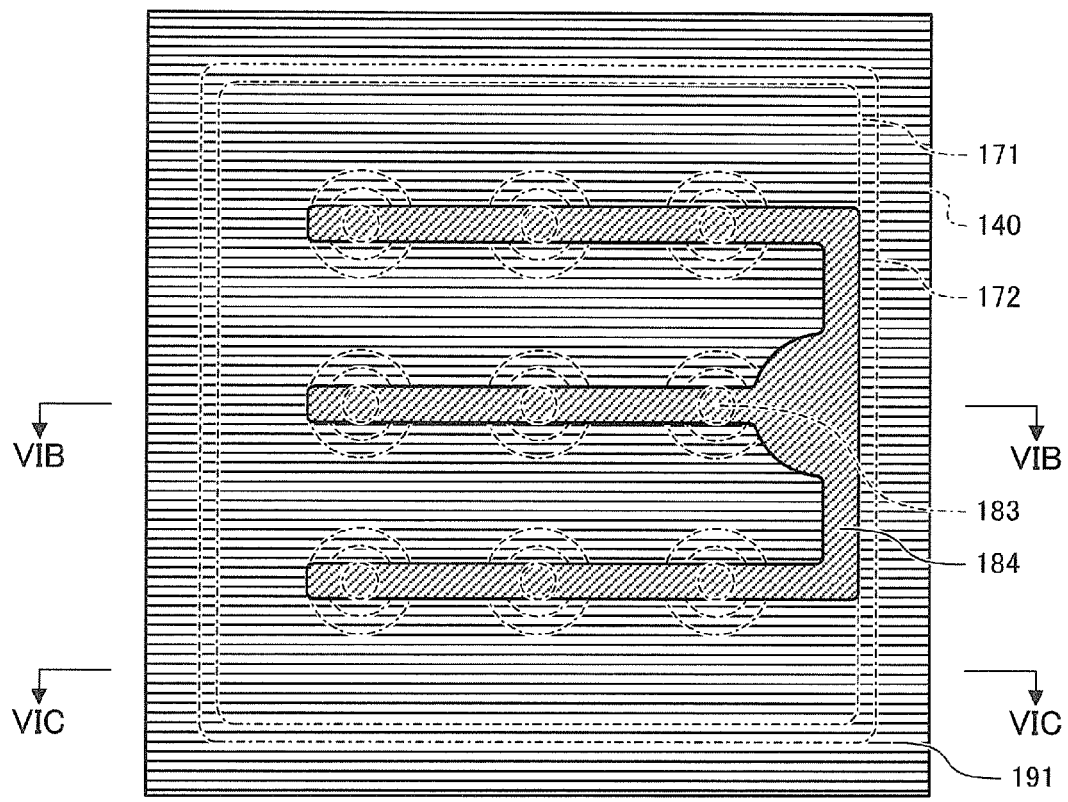
FIGS. 6A to 6C are diagrams illustrating an example of an n-side power supply portion forming process.
Figure 6B:
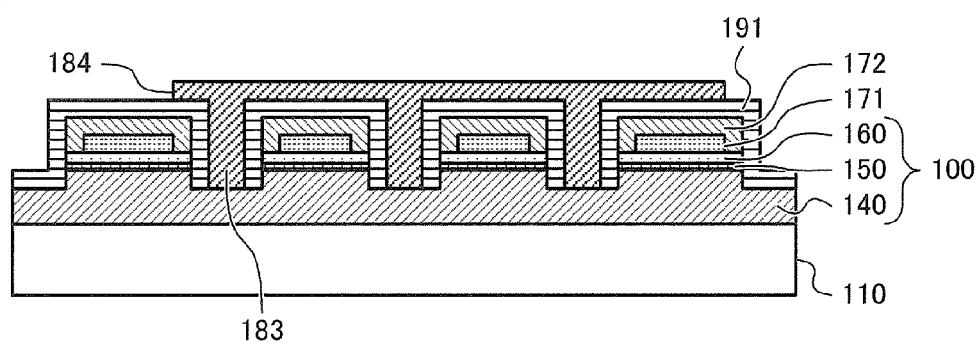
Figure 6C:
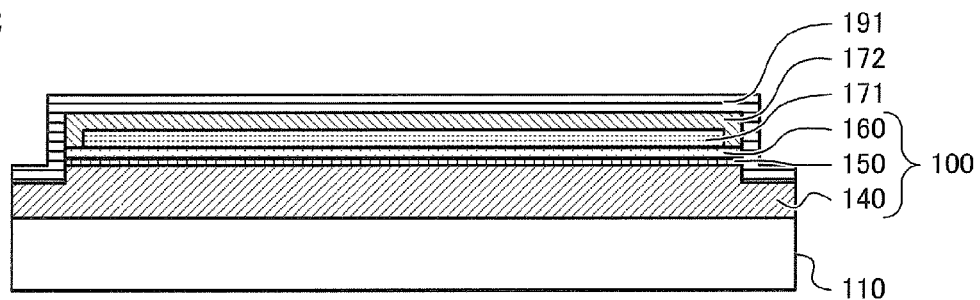

FIGS. 6A to 6C are diagrams for illustrating an example of the n-side power supply portion forming process. Here, FIG. 6A shows a top view corresponding to FIG. 1A, FIG. 6B shows a cross-portional view corresponding to FIG. 1B, which is taken along VIB-VIB in FIG. 6A, and FIG. 6C shows a cross-portional view corresponding to FIG. 1C, which is taken along VIC-VIC in FIG. 6A.

In the n-side power supply portion forming process, first, a metal film is laminated on an entire top surface. This forms the n-side layer-like conductor portion 184 composed of the metal film on the top surface of the first protecting layer 191, and forms the n-side columnar conductor portion 183 at the inside of each of the 9 holes by filling the metal. Here, as a matter of course, each of the n-side columnar conductor portions 183 and the n-side layer-like conductor portion 184 are integrated. It should be noted that the metal film can be formed by, for example, the sputtering method.

Then, in the n-side power supply portion forming process, after forming the metal film, wet etching is performed on the n-side layer-like conductor portion 184 so as to maintain the state where each of the n-side columnar conductor portions 183 is connected by the n-side layer-like conductor portion 184 and to form "E" shape. It should be noted that, at this time, part of the n-side layer-like conductor portion 184 is left semicircular for the planned location where the n-side power supply electrode 184a shown in FIGS. 1A to 1C is to be formed. Accordingly, the n-side layer-like conductor portion 184 is provided on a back surface side of the p-type semiconductor layer 160 as viewed from the light emitting layer 150 to face the surface of the light emitting layer 150.

Figure 10A:
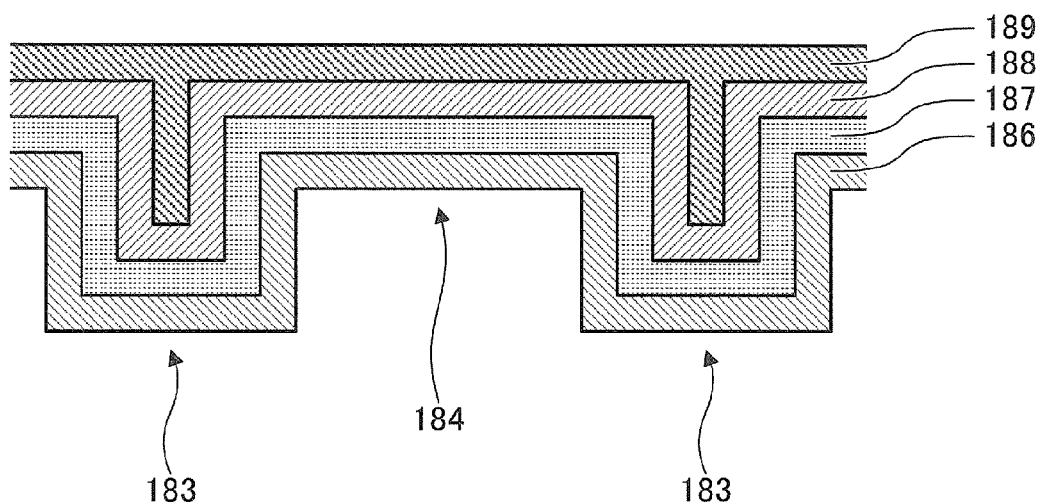
FIG. 10A is a cross-portional view showing an example of a configuration of plural n-side columnar conductor portions and an n-side layer-like conductor portion.

Here, FIG. 10A is a cross-portional view showing an example of a configuration of plural n-side columnar conductor portions 183 and the n-side layer-like conductor portion 184.

In the exemplary embodiment, plural n-side columnar conductor portions 183 and the n-side layer-like conductor portion 184 are configured by laminating, for example, an n-side first layer 186 composed of Al, an n-side second layer 187 composed of Ta, an n-side third layer 188 composed of Pt and an n-side fourth layer 189 composed of Au in this order.

The thickness of the n-side first layer 186 is preferably in a range of 80 nm to 200 nm. In the case where the thickness is less than 80 nm, the reflection coefficient by the n-side first layer 186 is reduced; therefore, it is unfavorable. In the case where the thickness is more than 200 nm, production costs of the light emitting element are increased; therefore, it is unfavorable.

The thickness of the n-side second layer 187 is preferably in a range of 20 nm to 200 nm. In the case where the thickness is less than 20 nm, there is a possibility that barrier properties for layers of both sides are deteriorated; therefore, it is unfavorable. In the case where the thickness is more than 200 nm, production costs of the light emitting element are increased; therefore, it is unfavorable.

The thickness of the n-side third layer 188 is preferably in a range of 50 nm to 200 nm. In the case where the thickness is less than 50 nm, there is a possibility that a reaction occurs between the n-side second layer 187 (for example, Ta) and the n-side fourth layer 189 (for example, Au). In the case where the thickness is more than 200 nm, production costs of the light emitting element are increased; therefore, it is unfavorable.

The thickness of the n-side fourth layer 189 is preferably in a range of 100 nm to 2 μm. In the case where the thickness is less than 100 nm, resistance of the n-side fourth layer 189 becomes high. In the case where the thickness is more than 2 μm, production costs of the light emitting element are increased; therefore, it is unfavorable.

<Second Protecting Layer Forming Process>

Figure 7A:
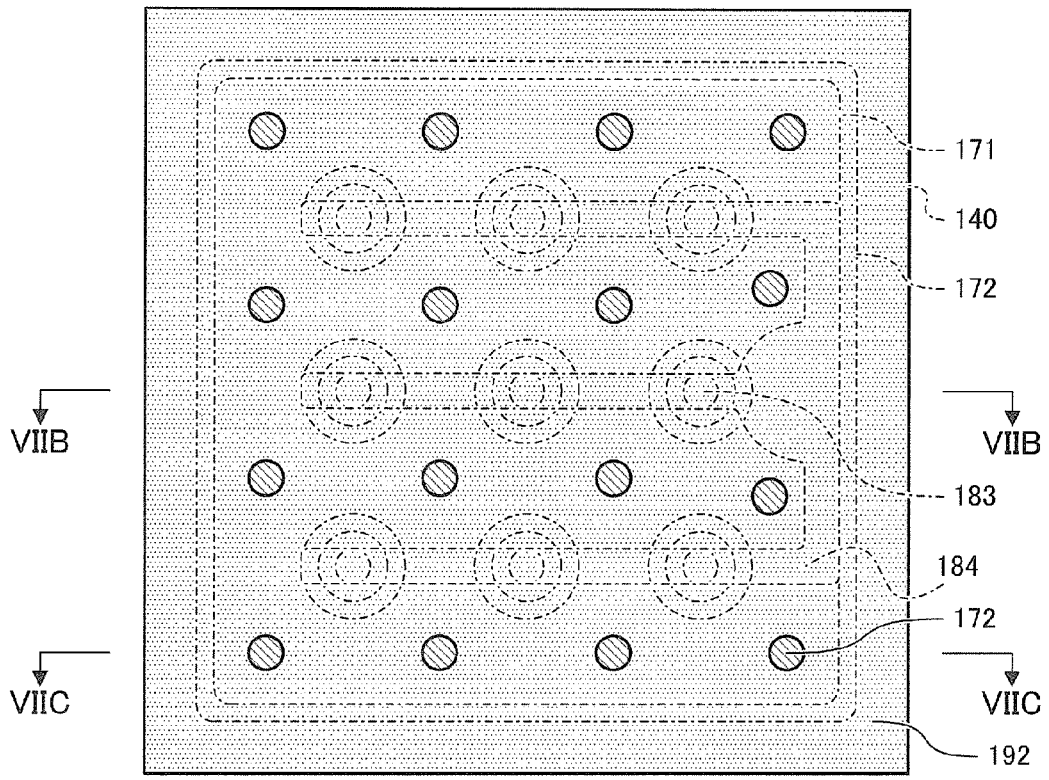
FIGS. 7A to 7C are diagrams illustrating an example of a second protecting layer forming process.
Figure 7B:
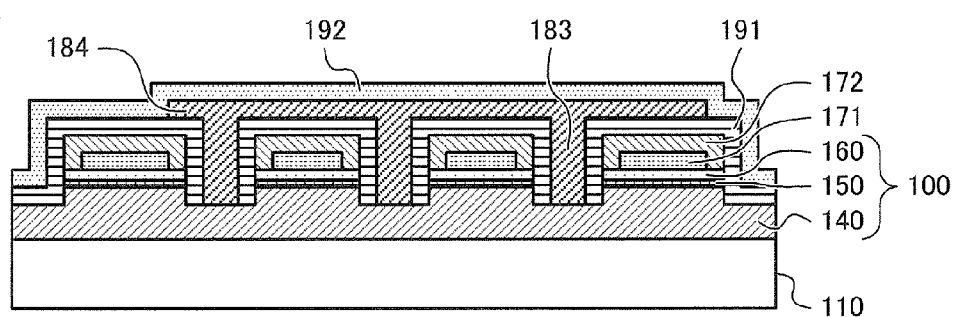
Figure 7C:
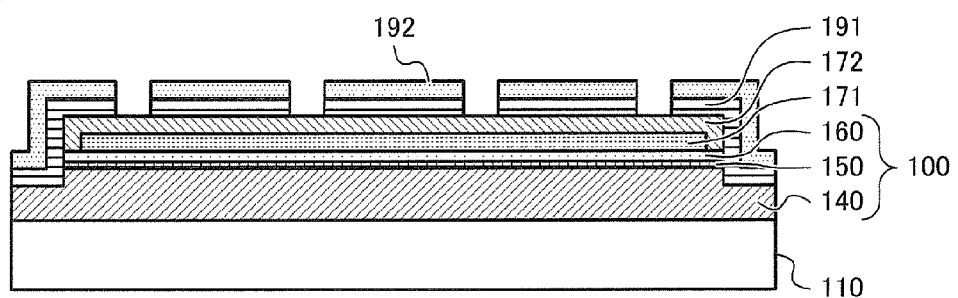

FIGS. 7A to 7C are diagrams for illustrating an example of the second protecting layer forming process. Here, FIG. 7A shows a top view corresponding to FIG. 1A, FIG. 7B shows a cross-portional view corresponding to FIG. 1B, which is taken along VIIB-VIIB in FIG. 7A, and FIG. 7C shows a cross-portional view corresponding to FIG. 1C, which is taken along VIIC-VIIC in FIG. 7A.

In the second protecting layer forming process, first, the second protecting layer 192 is laminated on an entire top surface. Here, the second protecting layer 192 corresponds to four layers of the protecting layer 190, and is configured by laminating the low-refractive-index layer 190a composed of $SiO_2$, the high-refractive-index layer 190b composed of $TiO_2$, the low-refractive-index layer 190a composed of $SiO_2$ and the high-refractive-index layer 190b composed of $TiO_2$ in this order. As described above, since the uppermost layer of the first protecting layer 190 is the high-refractive-index layer 190b composed of $TiO_2$, the low-refractive-index layer 190a constituting the second protecting layer 192 is formed thereon. At this time, the second protecting layer 192 covers the first protecting layer 191 and the n-side layer-like conductor portion 184 having been exposed at an upper portion. It should be noted that the second protecting layer 192 can be formed by, for example, the sputtering method.

Then, in the second protecting layer forming process, after forming the second protecting layer 192, dry etching is performed on planned locations where the p-side columnar conductor portions 173 shown in FIGS. 1A to 1C are to be formed to expose the overcoat layer 172 at these locations. This forms 16 (4×4) circular holes in total in the matrix state in the first protecting layer 191 and the second protecting layer 192. It should be noted that, as exemplified in FIG. 7C, these 16 holes are formed on positions that are on the surface of the light emitting layer 150 and are shifted from the positions where the n-side columnar conductor portions 183 and the n-side layer-like conductor portion 184 are formed.

<P-Side Power Supply Portion Forming Process>

Figure 8A:
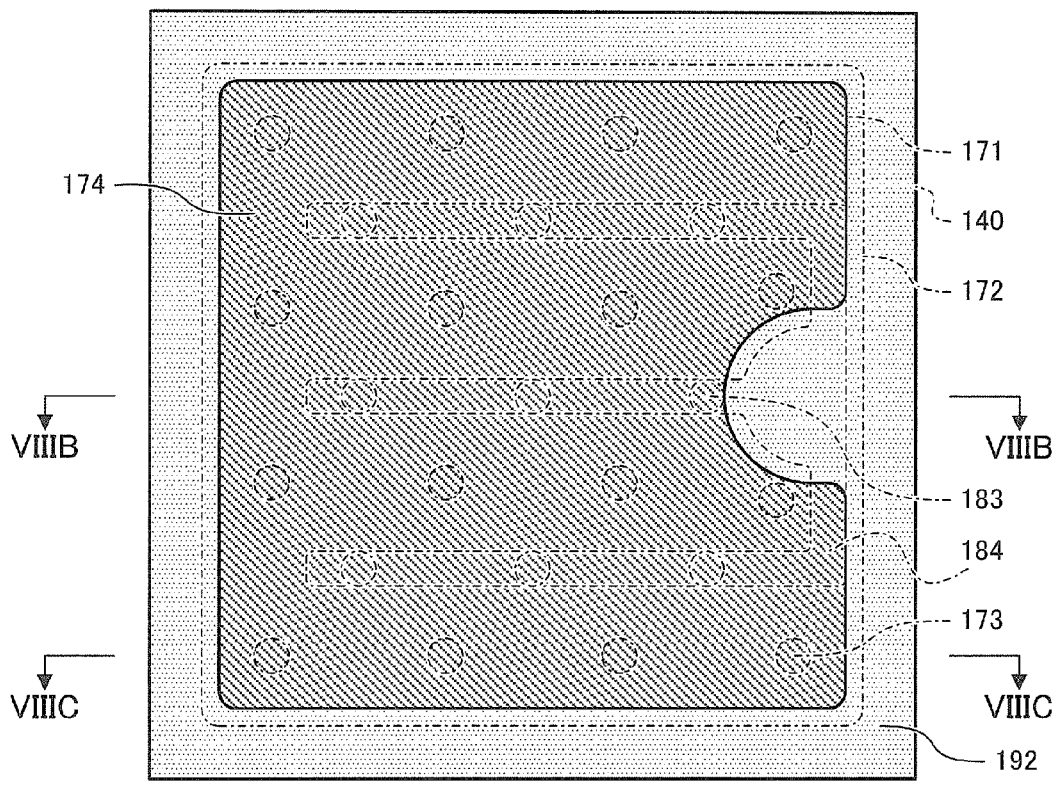
FIGS. 8A to 8C are diagrams illustrating an example of a p-side power supply portion forming process.
Figure 8B:
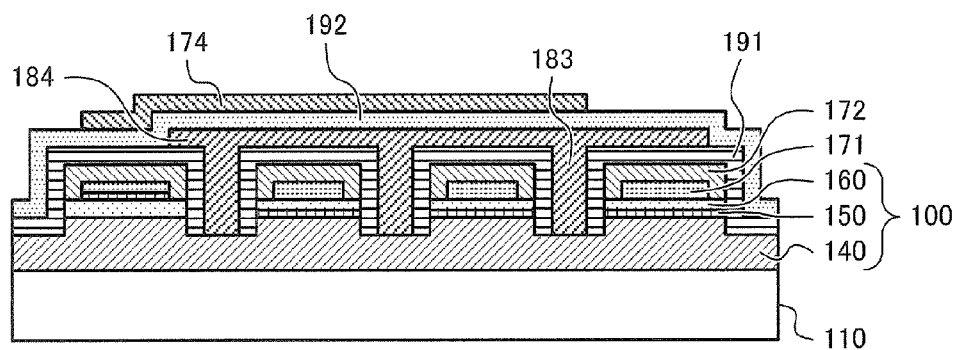
Figure 8C:
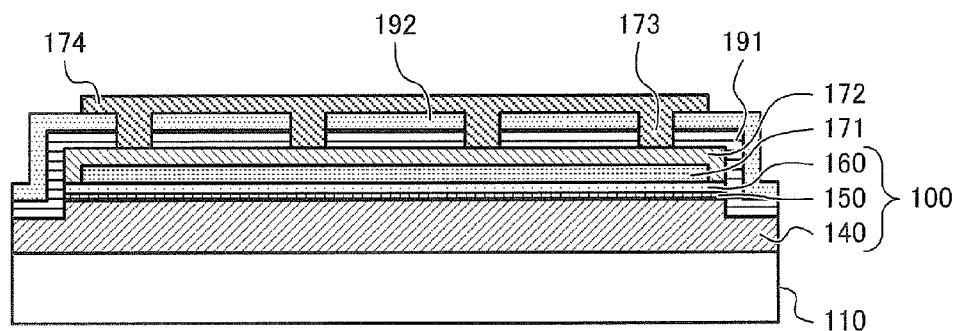

FIGS. 8A to 8C are diagrams for illustrating an example of the p-side power supply portion forming process. Here, FIG. 8A shows a top view corresponding to FIG. 1A, FIG. 8B shows a cross-portional view corresponding to FIG. 1B, which is taken along VIIIB-VIIIB in FIG. 8A, and FIG. 8C shows a cross-portional view corresponding to FIG. 1C, which is taken along VIIIC-VIIIC in FIG. 8A.

In the p-side power supply portion forming process, first, a metal film is laminated on an entire top surface. This forms the p-side layer-like conductor portion 174 composed of the metal film on the top surface of the second protecting layer 192, and forms the p-side columnar conductor portion 173 at the inside of each of the 16 holes by filling the metal. Here, as a matter of course, each of the p-side columnar conductor portions 173 and the p-side layer-like conductor portion 174 are integrated. It should be noted that the metal film can be formed by, for example, the sputtering method.

Then, in the p-side power supply portion forming process, after forming the metal film, wet etching is performed on the p-side layer-like conductor portion 174 so as to maintain the state where each of the p-side columnar conductor portions 173 is connected by the p-side layer-like conductor portion 184 and to remove the edge portions, a planned location where the n-side power supply electrode 184a shown in FIGS. 1A to 1C is to be formed and a periphery thereof. Accordingly, the p-side layer-like conductor portion 174 is provided on a back surface side of the p-type semiconductor layer 160 as viewed from the light emitting layer 150 to face the surface of the light emitting layer 150. In addition, on the surface of the light emitting layer 150, the p-side layer-like conductor portion 174 and the n-side layer-like conductor portion 184 are arranged to be overlapped one another. Further, with respect to the surface of the light emitting layer 150, one n-side columnar conductor portion 183 is provided among four p-side columnar conductor portions 173, or one p-side columnar conductor portion 173 is provided among four n-side columnar conductor portions 183. Still further, with respect to the surface of the light emitting layer 150, each of the p-side columnar conductor portions 173 and each of the n-side columnar conductor portions 183 are provided in a staggered configuration.

Figure 10B:
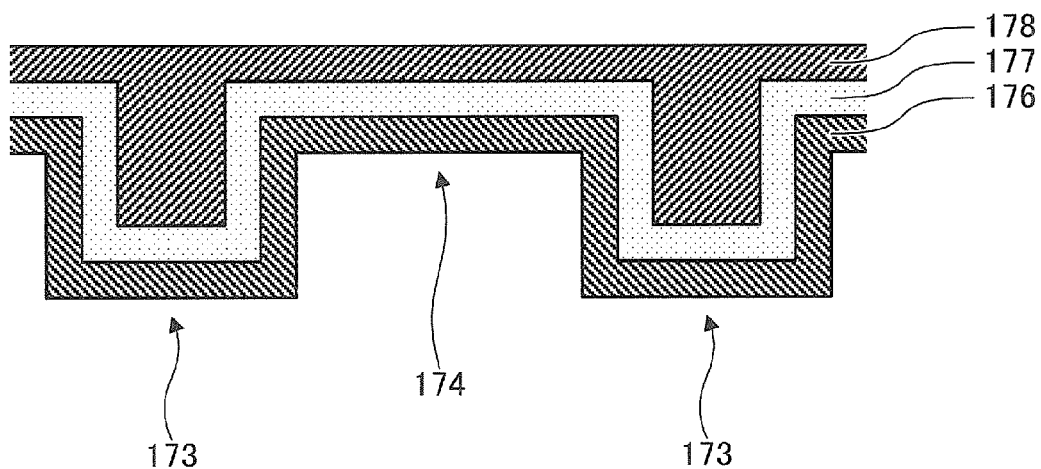
FIG. 10B is a cross-portional view showing an example of a configuration of plural p-side columnar conductor portions and a p-side layer-like conductor portion.

Here, FIG. 10B is a cross-portional view showing an example of a configuration of plural p-side columnar conductor portions 173 and a p-side layer-like conductor portion 174. With regard to the p-side columnar conductor portions 173, the diameter of the hole is preferably in a range of 10 μm to 50 μm, the length (depth) is, though dependent on the thickness of the protecting layer 190 or the like, preferably in a range of 300 nm to 5 μm, and for example, the diameter of the order of 10 μm and the length (depth) of the order of 850 nm are adopted. Here, in the case where the diameter of the hole is less than 10 μm, it becomes difficult to laminate (implant) a material in sputtering, and a contact resistance of an interface with the n-type semiconductor layer 140 becomes larger, and thereby efficiency of current diffusion is reduced. On the other hand, in the case where the diameter of the hole is more than 50 μm, the light emission area is reduced, and therefore, it is unfavorable as a light emitting element.

In the exemplary embodiment, plural p-side columnar conductor portions 173 and the p-side layer-like conductor portion 174 are configured by laminating, for example, a p-side first layer 176 composed of Ti or Ta, a p-side second layer 177 composed of Pt, and a p-side third layer 178 composed of Au in this order.

The thickness of the p-side first layer 176 is preferably in a range of 20 nm to 200 nm. In the case where the thickness is less than 20 nm, there is a possibility that barrier properties for layers of both sides are deteriorated; therefore, it is unfavorable. In the case where the thickness is more than 200 nm, production costs of the light emitting element are increased; therefore, it is unfavorable.

The thickness of the p-side second layer 177 is preferably in a range of 50 nm to 200 nm. In the case where the thickness is less than 50 nm, there is a possibility that a reaction occurs between the p-side first layer 176 (for example, Ti or Ta) and the p-side third layer 178 (for example, Au). In the case where the thickness is more than 200 nm, production costs of the light emitting element are increased; therefore, it is unfavorable.

The thickness of the p-side third layer 178 is preferably in a range of 100 nm to 2 μm. In the case where the thickness is less than 100 nm, resistance of the p-side third layer 178 becomes high. In the case where the thickness is more than 2 μm, production costs of the light emitting element are increased; therefore, it is unfavorable.

<Third Protecting Layer Forming Process>

Figure 9A:
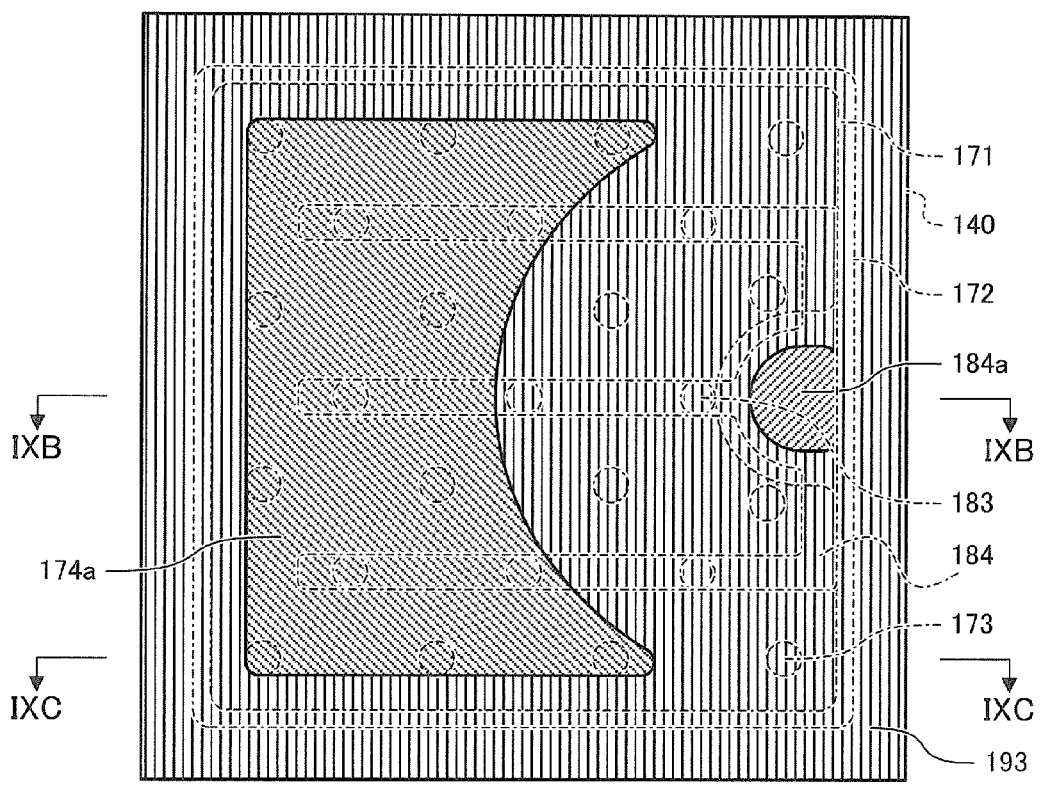
FIGS. 9A to 9C are diagrams illustrating an example of a third protecting layer forming process.
Figure 9B:
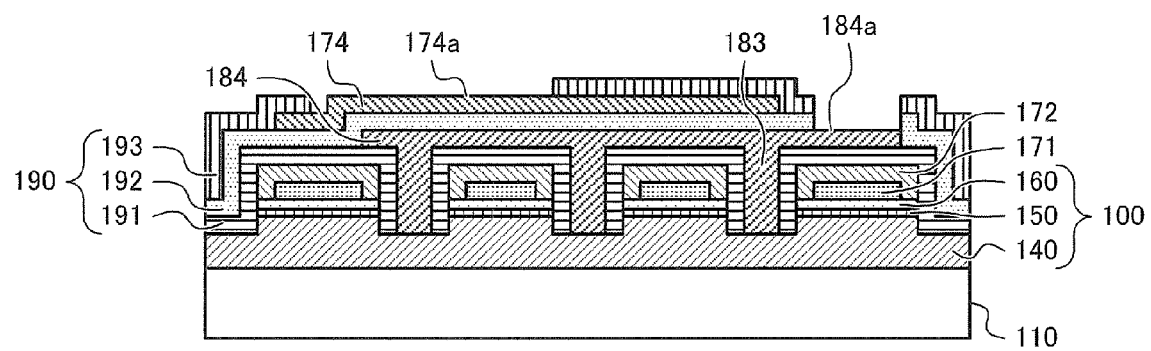
Figure 9C:
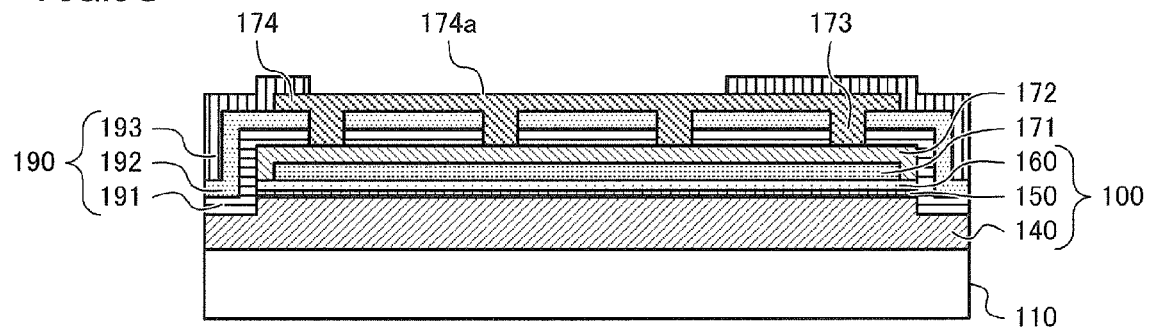

FIGS. 9A to 9C are diagrams for illustrating an example of the third protecting layer forming process. Here, FIG. 9A shows a top view corresponding to FIG. 1A, FIG. 9B shows a cross-portional view corresponding to FIG. 1B, which is taken along IXB-IXB in FIG. 9A, and FIG. 9C shows a cross-portional view corresponding to FIG. 1C, which is taken along IXC-IXC in FIG. 9A.

In the third protecting layer forming process, first, a third protecting layer 193 is laminated on an entire top surface. Here, the third protecting layer 193 corresponds to three layers of the protecting layer 190, and is configured by laminating the low-refractive-index layer 190a composed of SiO$_2$, the high-refractive-index layer 190b composed of TiO$_2$ and the low-refractive-index layer 190a composed of SiO$_2$ in this order. As described above, since the uppermost layer of the second protecting layer 192 is the high-refractive-index layer 190b composed of TiO$_2$, the low-refractive-index layer 190a constituting the third protecting layer 193 is formed thereon. At this time, the third protecting layer 193 covers the second protecting layer 192 and the p-side layer-like conductor portion 174 having been exposed at an upper portion. It should be noted that the third protecting layer 193 can be formed by, for example, the sputtering method.

Then, in the third protecting layer forming process, after forming the third protecting layer 193, dry etching is performed on a planned location where the p-side power supply electrode 174a is to be formed and a planned location where the n-side power supply electrode 184a is to be formed as shown in FIGS. 1A to 1C, and thereby part of the p-side layer-like conductor portion 174 is exposed to form the p-side power supply electrode 174a and part of the n-side layer-like conductor portion 184 is exposed to form the n-side power supply electrode 184a. Further, the first protecting layer 191, the second protecting layer 192 and the third protecting layer 193 constitute the protecting layer 190 that also serves as an insulating layer and a reflecting layer.

By the above-described processes, the light emitting element 1 shown in FIGS. 1A to 1C can be obtained.

Figure 11A:
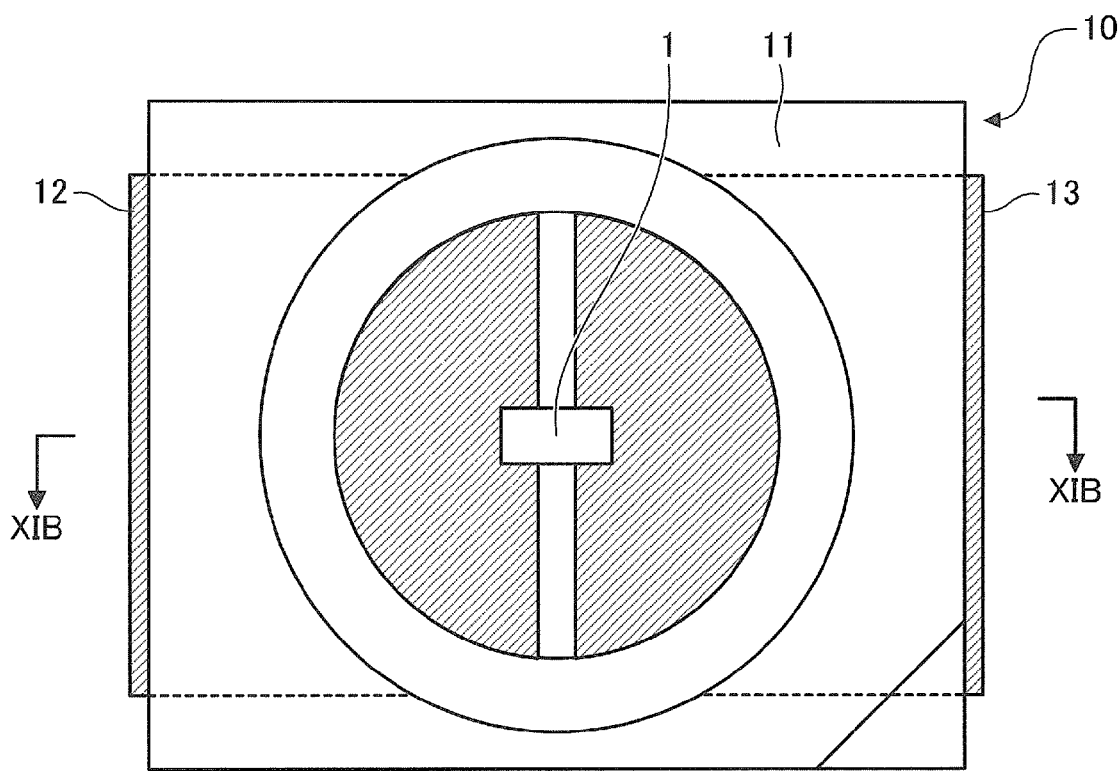
FIGS. 11A and 11B are diagrams showing an example of a configuration of a light emitting chip equipped with the semiconductor light emitting element shown in FIGS. 1A to 1C.
Figure 11B:
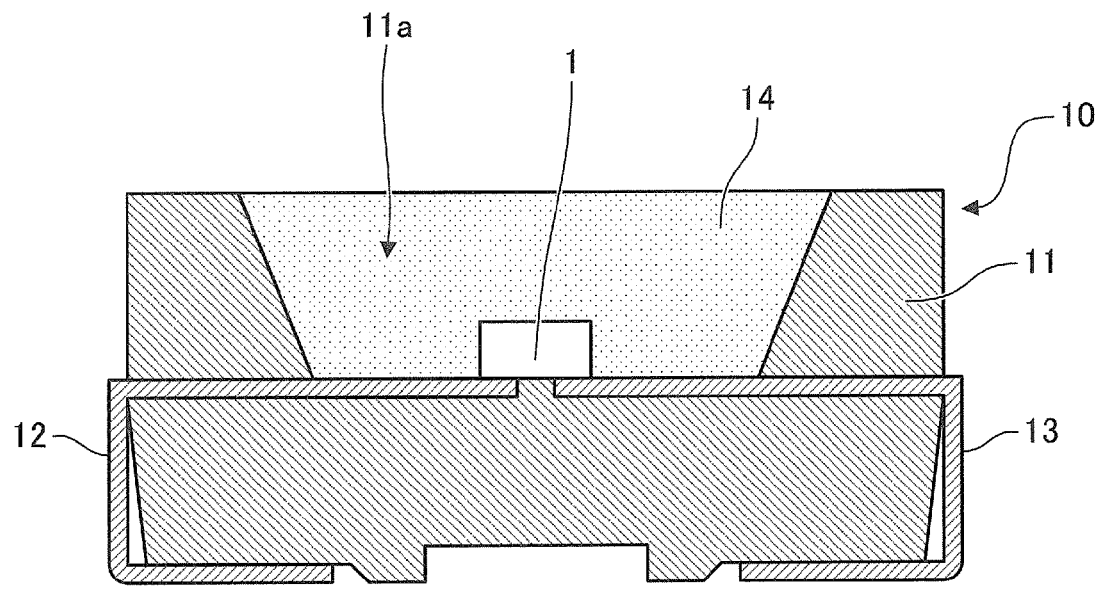

FIGS. 11A and 11B are diagrams showing an example of a configuration of a light emitting chip 10 equipped with the semiconductor light emitting element 1 as shown in FIGS. 1A to 1C. Here, FIG. 11A shows a top view of the light emitting chip 10, and FIG. 11B shows a cross-portional view taken along XIB-XIB in FIG. 11A.

The light emitting chip 10 includes: a housing 11 on one side of which a concave portion 11a is formed; a first lead portion 12 and a second lead portion 13 composed of lead frames formed in the housing 11; the semiconductor light emitting element 1 attached to a bottom surface of the concave portion 11a; and a sealing portion 14 provided to cover the concave portion 11a. It should be noted that an illustration of the sealing portion 14 is omitted in FIG. 11A.

The housing 11 as an example of a base portion is formed by injection molding of a white thermoplastic resin on a metal lead portion including the first lead portion 12 and the second lead portion 13.

The first lead portion 12 and the second lead portion 13 are metal plates having a thickness of the order of 0.1 mm to 0.5 mm, and configured by laminating several μm of nickel, titanium, gold or silver as a plating layer on an alloy of iron and copper, for example, which is a metal having excellent workability and thermal conductivity, as a base. In the exemplary embodiment, part of each of the first lead portion 12 and the second lead portion 13 is exposed at the bottom surface of the concave portion 11a. Further, one end portion of each of the first lead portion 12 and the second lead portion 13 is exposed to the outside of the housing 11 and is bent from an outer wall surface toward a back surface side of the housing 11. It should be noted that, in the exemplary embodiment, the first lead portion 12 functions as a first wiring and the second lead portion 13 functions as a second wiring.

Moreover, the semiconductor light emitting element 1 is attached over the first lead portion 12 and the second lead portion 13.

The sealing portion 14 is configured with a transparent resin having high optical transparency in a visible region wavelength and high refractive index. As the resin constituting the sealing portion 14, which satisfies the properties of high heat resistance, high weather resistance and high mechanical strength, for example, an epoxy resin or a silicone resin can be used. In the exemplary embodiment, the transparent resin constituting the sealing portion 14 contains a phosphor that converts a part of the light emitted from the semiconductor light emitting element 1 into green light and red light. It should be noted that, instead of such a phosphor, a phosphor that converts a part of blue light into yellow light or a phosphor that converts a part of blue light into yellow light and red light may be contained.

In the exemplary embodiment, in the state where the semiconductor light emitting element 1 shown in FIGS. 1A to 1C is vertically reversed with respect to the concave portion 11a of the light emitting chip 10, the first lead portion 12 and the second lead portion 13 are electrically connected to the p-side power supply electrode 174a and the n-side power supply electrode 184a by use of solder, respectively, and are mechanically secured. Such a connecting method of the semiconductor light emitting element 1 is referred to as flip-chip connection in general.

It should be noted that an electronic appliance, such as a backlight, a mobile cellular telephone, a display, various kinds of panels and the like, a computer, a game machine and illumination incorporating the light emitting chip 10 according to the exemplary embodiment, and a mechanical device incorporating those electronic appliances, such as an automobile, is equipped with the semiconductor light emitting element 1 having excellent light emitting properties. Especially, in the electronic appliance that is battery operated, such as the backlight, the mobile cellular telephone, the display, the game machine and the illumination, an excellent product equipped with the semiconductor light emitting element 1 having excellent light emitting properties can be provided; and therefore, it is favorable. In addition, the configuration of the light emitting chip 10 including the semiconductor light emitting element 1 is not limited to that shown in FIGS. 11A and 11B, and a package configuration called, for example, a shell type may be employed.

Then, a description will be given to light emitting operation of the light emitting chip 10 shown in FIGS. 11A and 11B and the semiconductor light emitting element 1 incorporated into the light emitting chip 10.

In the light emitting chip 10, when an electric current from the first lead portion 12 toward the second lead portion 13 is passed through the semiconductor light emitting element 1, an electric current flows from the p-side power supply portion 170 toward the n-side power supply portion 180 through the p-type semiconductor layer 160, the light emitting layer 150 and the n-type semiconductor layer 140 in the semiconductor light emitting element 1. At this time, in the p-side power supply portion 170, the electric current is supplied from the p-side power supply electrode 174a to each of the p-side columnar conductor portions 173 through the p-side layer-like conductor portion 174, and the electric current passes from each of the p-side columnar conductor portions 173 to the p-type semiconductor layer 160 through the overcoat layer 172 and the power supply reflecting layer 171. On the other hand, in the n-side power supply portion 180, an electric current passes from the n-type semiconductor layer 140 to the n-side power supply electrode 184a through each of the n-side columnar conductor portions 183 and the n-side layer-like conductor portion 184. This makes the light emitting layer 150 emit light in accordance with composition thereof (for example, blue light) mainly composed of light proceeding toward the n-type semiconductor layer 140 and light proceeding toward the p-type semiconductor layer 160.

Of the light emitted from the light emitting layer 150, the light proceeding toward the n-type semiconductor layer 140 passes through the substrate 110 from the n-type semiconductor layer 140, and is emitted to the outside of the semiconductor light emitting element 1, namely, toward an upward direction in FIG. 11B.

Further, of the light emitted from the light emitting layer 150, part of the light proceeding toward the p-type semiconductor layer 160 reaches the power supply reflecting layer 171 via the p-type semiconductor layer 160, and is reflected by the metal reflecting layer (not shown) provided in the power supply reflecting layer 171. The reflected light passes through the p-type semiconductor layer 160, the light emitting layer 150, the n-type semiconductor layer 140 and the substrate 110, and is emitted to the outside of the semiconductor light emitting element 1.

On the other hand, of the light emitted from the light emitting layer 150, light proceeding toward a lateral direction is reflected by the protecting layer 190. Then, the light reflected by the protecting layer 190 proceeds within the semiconductor light emitting element 1, and thereafter, is emitted to the outside of the semiconductor light emitting layer 1.

Moreover, part of light directly proceeding from the light emitting layer 150 toward the substrate 110, part of light proceeding from the light emitting layer 150 toward the substrate 110 which is reflected by the power supply reflecting layer 171 and part of light proceeding from the light emitting layer 150 toward the substrate 110 which is reflected by the protecting layer 190 are reflected at a boundary between the substrate 110 and the outside, for example, and return to the inside of the semiconductor light emitting element 1. The light having returned to the inside of the semiconductor light emitting element 1 in this manner is reflected by the metal reflecting layer (not shown) provided in the power supply reflecting layer 171 of the p-side power supply portion 170 or the protecting layer 190, proceeds toward the substrate 110 again, and thereafter, is emitted to the outside of the semiconductor light emitting element 1.

Here, in the exemplary embodiment, since the n-side layer-like conductor portion 184 that electrically connects each of the n-side columnar conductor portions 183 is provided on the back surface side of the p-type semiconductor layer 160 as viewed from the light emitting layer 150, it becomes unnecessary to trim the light emitting layer 150 for connecting thereof. Accordingly, it becomes possible to suppress reduction of the area of the light emitting layer 150 in the semiconductor light emitting element 1 of the same area, and as a result, it becomes possible to suppress reduction of an amount of outputted light.

Moreover, in the exemplary embodiment, the plural p-side columnar conductor portions 173 are connected to the p-type semiconductor layer 160 side and the plural n-side columnar conductor portions 183 are connected to the n-type semiconductor layer 140 side to make it easy to diffuse the electric current passing through the light emitting layer 150 provided between the p-type semiconductor layer 160 and the n-type semiconductor layer 140. Especially, in the exemplary embodiment, since one n-side columnar conductor portion 183 is arranged among the plural (in the exemplary embodiment, four) p-side columnar conductor portions 173 and one p-side columnar conductor portion 173 is arranged among the plural (in the exemplary embodiment, four) n-side columnar conductor portions 183, the electric current from the p-type semiconductor layer 160 toward the n-type semiconductor layer 140 through the light emitting layer 150 is likely to be diffused in in-plane directions. As a result, in-plane nonuniformity of the electric current passing through the light emitting layer 150 is suppressed, and thereby it becomes possible that the light emitting layer 150 outputs light in the state where the in-plane nonuniformity is suppressed.

Further, in the exemplary embodiment, the p-side layer-like conductor portion 174 that electrically connects the plural p-side columnar conductor portions 173 and the n-side layer-like conductor portion 184 that electrically connects the plural p-side columnar conductor portions 183 are arranged to be three-dimensionally piled on the surface of the light emitting layer 150. This makes it possible to suppress increase of the area of the semiconductor light emitting element 1 in comparison with the case where wirings are two-dimensionally arranged.

It should be noted that, in the exemplary embodiment, the plural p-side columnar conductor portions 173 and the p-side layer-like conductor portion 174 are integrally formed; however, they are not limited thereto, and may be separately formed. Further, in the exemplary embodiment, the plural n-side columnar conductor portions 183 and the n-side layer-like conductor portion 184 are integrally formed; however, they are not limited thereto, and may be separately formed.

In addition, in the exemplary embodiment, the number of the p-side columnar conductor portions 173 is 16 and the number of the n-side columnar conductor portions 183 is 9; however, the number of each of the p-side columnar conductor portions 173 and the n-side columnar conductor portions 183 may be changed.

REFERENCE SIGNS LIST

1 . . . Semiconductor light emitting element
10 . . . Light emitting chip
11 . . . Housing
12 . . . First lead portion
13 . . . Second lead portion
14 . . . Sealing portion
110 . . . Substrate
140 . . . N-type semiconductor layer
150 . . . Light emitting layer
160 . . . P-type semiconductor layer
170 . . . P-side power supply portion
171 . . . Power supply reflecting layer
172 . . . Overcoat layer
173 . . . P-side columnar conductor portion
174 . . . P-side layer-like conductor portion
174a . . . P-side power supply electrode
180 . . . N-side power supply portion
183 . . . N-side columnar conductor portion
184 . . . N-side layer-like conductor portion
184a . . . N-side power supply electrode
190 . . . Protecting layer
190a . . . Low-refractive-index layer
190b . . . High-refractive-index layer

The invention claimed is:

1. A semiconductor light emitting element comprising:
a first semiconductor layer that is configured with a group III nitride semiconductor having a first conduction type;
a light emitting layer that is configured with a group III nitride semiconductor, laminated on the first semiconductor layer, and emits light by passing an electric current therethrough;
a second semiconductor layer that is configured with a group III nitride semiconductor having a second conduction type that is different from the first conduction type, and is laminated on the light emitting layer;
a plurality of first conductor portions, each of which is provided to penetrate the second semiconductor layer and the light emitting layer, electrically insulated from the second semiconductor layer and the light emitting layer and is electrically connected to the first semiconductor layer;
a first connective conductor portion that is provided on a back surface side of the second semiconductor layer as viewed from the light emitting layer to face a surface of the light emitting layer and is electrically connected to the plurality of first conductor portions;
a plurality of second conductor portions, each of which is electrically insulated from the first conductor portions and the first connective conductor portion and is electrically connected to the second semiconductor layer; and
a second connective conductor portion that is provided on a back surface side of the second semiconductor layer as viewed from the light emitting layer to face the light emitting layer, electrically insulated from the first conductor portions and the first connective conductor portion and is electrically connected to the plurality of second conductor portions.

2. The semiconductor light emitting element according to claim 1, wherein the first connective conductor portion and the second connective conductor portion are arranged to be overlaid on the surface of the light emitting layer.

3. The semiconductor light emitting element according to claim 1, wherein one of the second conductor portions is arranged among the plurality of first conductor portions or one of the first conductor portions is arranged among the plurality of second conductor portions with respect to the surface of the light emitting layer.

4. The semiconductor light emitting element according to claim 1, wherein the plurality of first conductor portions and the plurality of second conductor portions are arranged in a staggered configuration with respect to the surface of the light emitting layer.

5. The semiconductor light emitting element according to claim 1, further comprising a diffusing layer that is laminated on the second semiconductor layer and is electrically connected to the plurality of second conductor portions to diffuse an electric current supplied through the plurality of second conductor portions, wherein the diffusing layer contains a metal layer having a reflective property to light emitted from the light emitting layer.

6. The semiconductor light emitting element according to claim 1, further comprising an insulating portion that electrically insulates the first conductor portions and the first connective conductor portion from the second conductor portions and the second connective conductor portion, wherein the insulating portion is configured with a multi-layer reflecting film that is configured by alternately laminating a first-refractive-index layer having a first refractive index and transparency to light emitted from the light emitting layer and a second-refractive-index layer having a second refractive index, which is higher than the first refractive index, and transparency to the light emitted from the light emitting layer, the multi-layer reflecting film reflecting the light emitted from the light emitting layer.

7. An electronic apparatus incorporating the semiconductor light emitting element according to claim 1.

8. A light emitting device comprising:
a base portion on which a first wiring and a second wiring are formed; and
a semiconductor light emitting element that is mounted on the base portion with flip-chip connection,
wherein the semiconductor light emitting element comprises:
a first semiconductor layer that is configured with a group III nitride semiconductor having a first conduction type;
a light emitting layer that is configured with a group III nitride semiconductor, laminated on the first semiconductor layer, and emits light by passing an electric current therethrough;
a second semiconductor layer that is configured with a group III nitride semiconductor having a second conduction type that is different from the first conduction type, and is laminated on the light emitting layer;
a plurality of first conductor portions, each of which is provided to penetrate the second semiconductor layer and the light emitting layer, electrically insulated from the second semiconductor layer and the light emitting layer and is electrically connected to the first semiconductor layer;

a first connective conductor portion that is provided on a back surface side of the second semiconductor layer as viewed from the light emitting layer to face a surface of the light emitting layer and is electrically connected to the plurality of first conductor portions and the first wiring provided on the base portion;

a plurality of second conductor portions, each of which is electrically insulated from the first conductor portions and the first connective conductor portion and is electrically connected to the second semiconductor layer; and a second connective conductor portion that is provided on a back surface side of the second semiconductor layer as viewed from the light emitting layer to face the light emitting layer, electrically insulated from the first conductor portions and the first connective conductor portion and is electrically connected to the plurality of second conductor portions and the second wiring provided on the base portion.

* * * * *